US012107529B2

(12) United States Patent
Lee et al.

(10) Patent No.: US 12,107,529 B2
(45) Date of Patent: Oct. 1, 2024

(54) MOVABLE SOLAR MODULE DISASSEMBLING APPARATUS AND MOVABLE SOLAR MODULE DISASSEMBLING SYSTEM COMPRISING THEREOF

(71) Applicant: Won Kwang S&T Co., Ltd., Incheon (KR)

(72) Inventors: Sang Hun Lee, Incheon (KR); Jun Kee Kim, Seoul (KR); Tae Eun Lee, Incheon (KR); Cheong Min Noh, Incheon (KR); Geun Sik Cho, Incheon (KR); Su Hyon Eom, Incheon (KR)

(73) Assignee: WON KWANG S&T CO., LTD., Incheon (KR)

( * ) Notice: Subject to any disclaimer, the term of this patent is extended or adjusted under 35 U.S.C. 154(b) by 434 days.

(21) Appl. No.: 17/519,645

(22) Filed: Nov. 5, 2021

(65) Prior Publication Data

US 2023/0047286 A1   Feb. 16, 2023

(30) Foreign Application Priority Data

Aug. 10, 2021 (KR) .......................... 10-2021-0105653

(51) Int. Cl.
*B23P 19/00* (2006.01)
*H02S 10/40* (2014.01)
(Continued)

(52) U.S. Cl.
CPC .............. *H02S 10/40* (2014.12); *H02S 40/10* (2014.12); *H02S 40/38* (2014.12); *H02S 99/00* (2013.01)

(58) Field of Classification Search
CPC ....... H01L 31/048; H02S 10/40; H02S 40/10; H02S 40/38; H02S 99/00; Y02E 10/50;
(Continued)

(56) References Cited

U.S. PATENT DOCUMENTS 11,491,774 B1 * 11/2022 Lee .................... H01L 31/18
11,491,775 B1 * 11/2022 Lee .................... B32B 43/006
2017/0266947 A1 * 9/2017 Tateyama .............. B32B 9/041

FOREIGN PATENT DOCUMENTS

KR        10-2037120 B1     10/2019
KR     10-2020-0034100 A      3/2020
(Continued)

*Primary Examiner* — Paul D Kim
(74) *Attorney, Agent, or Firm* — The PL Law Group, PLLC

(57) ABSTRACT

A movable solar module disassembling apparatus according to an embodiment of the present disclosure includes a movable container unit that is hollow, can be moved by itself or by external power, and has at least one door being able to expose the inside by opening and closing, a frame separation unit that is disposed in the movable container unit, includes a frame separation blade pressing and separating the frame from the module body, is supplied with the solar module, and discharges the module body after separating the frame, and a disassembling unit that is disposed continuously with the frame separation unit in the movable container unit, includes a scrapper scraping and separating the stacked film from the glass plate, is supplied with the module body, and disassembles and discharges the module body into the stacked film and the glass plate.

10 Claims, 5 Drawing Sheets

(51) Int. Cl.
*H02S 40/10* (2014.01)
*H02S 40/38* (2014.01)
*H02S 99/00* (2014.01)

(58) Field of Classification Search
CPC ..... Y02W 30/10; Y02W 30/20; Y02W 30/52; Y02W 30/62; Y02W 30/82
See application file for complete search history.

(56) References Cited

FOREIGN PATENT DOCUMENTS

| | | |
|---|---|---|
| KR | 10-2081776 B1 | 4/2020 |
| KR | 10-2154030 B1 | 9/2020 |
| KR | 10-2176239 B1 | 11/2020 |
| KR | 10-2020-0142457 A | 12/2020 |
| KR | 10-2185429 B1 | 12/2020 |
| KR | 10-2021-0083721 A | 7/2021 |

* cited by examiner

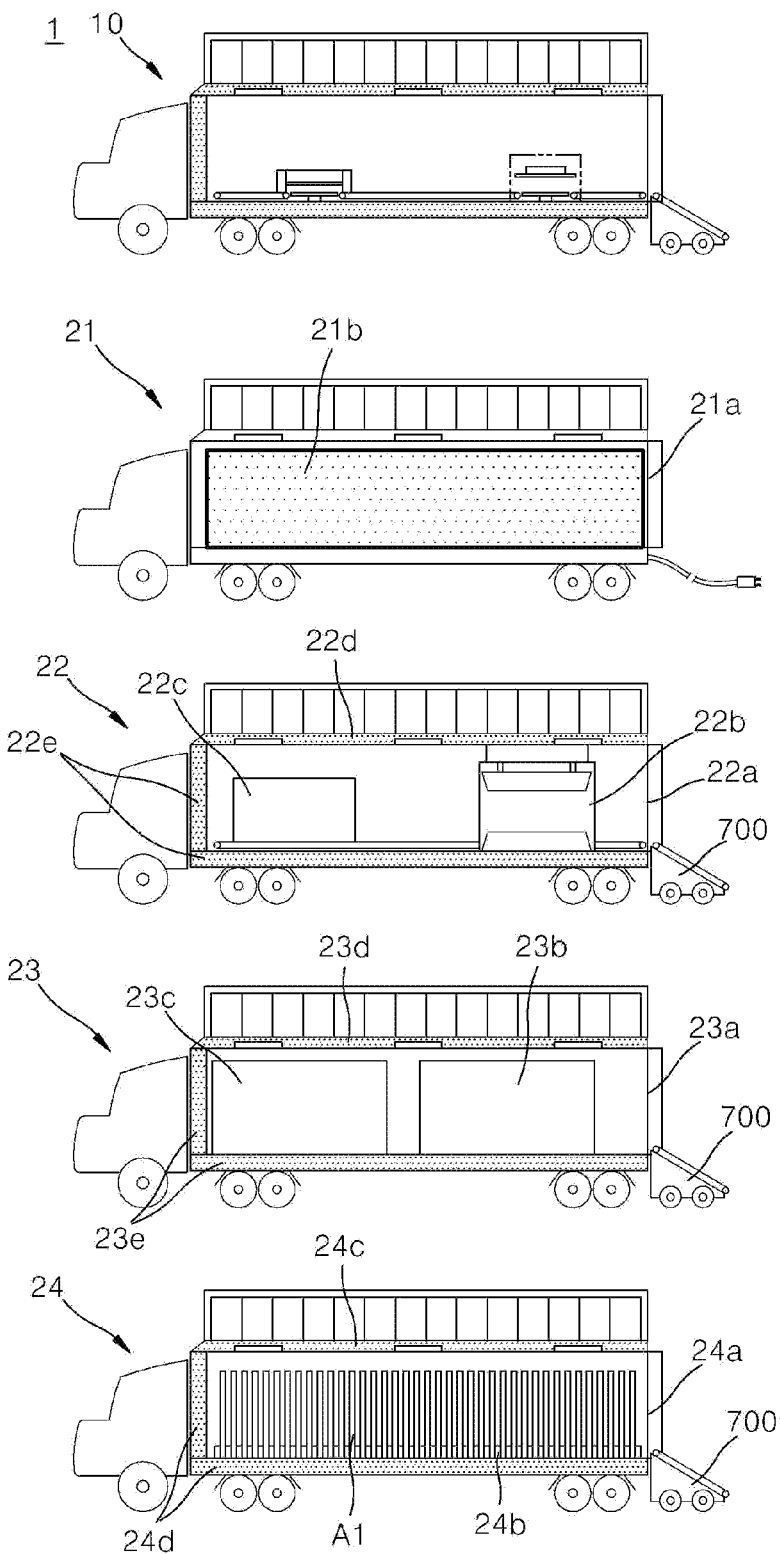

MOVABLE SOLAR MODULE DISASSEMBLING APPARATUS AND MOVABLE SOLAR MODULE DISASSEMBLING SYSTEM COMPRISING THEREOF

GOVERNMENT LICENSE RIGHTS

This invention was made with government support under National Research and Development Project (Project identification No. 1485017207, Project Serial No. 2020003100003, Research Administration Authority: Korea Environmental Industry & Technology Institute (KEITI), Research Program Name: R&D Project for recyclability of non-recyclable products, Research Project Name: Development of technology for collecting, shattering and recycling-recovery of valuable materials from end of life photovoltaic panel, Contribution Rate: 100%, and Period of Research: May 21, 2020 to Dec. 31, 2022) awarded by Korea Ministry of Environment (MOE). The government has certain rights in the invention.

CROSS-REFERENCE TO RELATED APPLICATION(S)

This application claims the benefit under 35 USC § 119(a) of Korean Patent Application No. 10-2021-0105653, filed on Aug. 10, 2021, in the Korean Intellectual Property Office, the entire disclosure of which is incorporated herein by reference for all purposes.

BACKGROUND

1. Field of the Invention

The present disclosure relates to a movable solar module disassembling apparatus and a movable solar module disassembling system including same, more specifically, to a movable solar module disassembling apparatus that can move to a site and operate at the site, and a movable solar module disassembling system including same.

2. Description of the Related Art

The development of clean energy that reduces environment pollution is being accelerated. Development of clean energy is in progress in various ways including national support projects. Clean energy technology variously includes not only a technology of managing produced power such as energy management, delivery, and storage, but a renewable energy technology that uses biomass, etc. Solar photovoltaic power generation, wind power generation, etc. that generate power using natural force without using the fossil fuel have been continuously studied as power production technologies.

In particular, solar photovoltaic power generation has been remarkably improved in power generation efficiency through continuous improvement of the technology since development, and accordingly, it is considered as a spotlighted alternative energy technology even at present. Solar photovoltaic power generation facilities are continuously increasing because there is the advantage that they can be easily applied even to places where conventional power generation facilities, etc. are difficult to install, they hardly cause environmental damage, and it is possible to use existing buildings, facilities, etc. when installing them.

However, a solar photovoltaic power generation facility also has a problem with maintenance because a solar cell has to be replaced and discarded when its lifespan is ended. In particular, as not only the number, but the application unit or area of solar photovoltaic power generation facilities are increased, it is required to replace and discard solar cells in large quantities. However, most solar photovoltaic power generation facilities are aggregate of photovoltaic modules formed by combining a solar cell in a frame. Further, since photovoltaic modules have a structure in which a glass plate, etc. are stacked, they are difficult to simply discard, which is a considerable problem in management of solar photovoltaic power generation facilities in a large scale. Further, it is considerably difficult to separately manage solar photovoltaic power generation facilities scattered in several places and it is also a problem to remove the facilities. Further, it is also difficult to process wastes into a recyclable form while reducing the wastes, so there is a need for appropriate measures for these problems.

SUMMARY

In order to solve the problems described above, an objective of the present disclosure is to provide a movable solar module disassembling apparatus that can move to a site and operate at the site, and a movable solar module disassembling system including the movable solar module disassembling apparatus. Another objective of the present disclosure is to smoothly manage solar photovoltaic power generation facilities scattered in several places, enable smooth replacement and discard of solar cells in a large scale, enable smooth removal, etc. of solar cells, and process solar cells in an easily recyclable form after discarding the solar cells, using a disassembling apparatus and a disassembling system.

The object of the present disclosure is not limited to those described above, and other objects may be made apparent to those skilled in the art from the following description.

A movable solar module disassembling apparatus according to the present disclosure is a movable solar module disassembling apparatus for disassembling a solar module including a glass plate, a stacked film including a solar cell stacked on the glass plate, and a frame surrounding a module body including the glass plate and the stacked film, and includes: a movable container unit that is hollow, can be moved by itself or by external power, and has at least one door being able to expose the inside by opening and closing; a frame separation unit that is disposed in the movable container unit, includes a frame separation blade pressing and separating the frame from the module body, is supplied with the solar module from a side, and discharges the module body from another side after separating the frame; and a disassembling unit that is disposed continuously with the frame separation unit in the movable container unit, includes a scrapper scraping and separating the stacked film from the glass plate, is supplied with the module body from a side, and disassembles and discharges the module body into the stacked film and the glass plate.

The movable container unit may have a plurality of surfaces, and the movable solar module disassembling apparatus may further include: a battery unit disposed in parallel with and in contact with a first surface of the plurality of surfaces of the movable container unit; and a power conversion unit disposed in parallel with and in close contact with a second surface different from the first surface.

The first surface may be the floor of the movable container unit and the second surface may be at least any one of sides of the movable container unit which are perpendicular to the first surface.

The movable solar module disassembling apparatus may further include a dust processing unit that is disposed on a third surface of the plurality of surfaces and suctions and processes dust in the movable container unit.

The movable solar module disassembling apparatus may further include a solar photovoltaic power generation unit that is installed outside the movable container unit and produces power.

The movable solar module disassembling apparatus may further include a movable supply unit that moves up the solar module from the ground outside the movable container unit, supplies the solar module into the movable container unit, and can be moved by itself or by external power.

The frame separation unit may further include a position adjustment plate that adjusts the vertical position of the solar module supplied from a side by supporting at the bottom and moving up and down the solar module such that the frame separation blade and the frame at least partially cross each other.

A plurality of frame separation blades may extend from the inner side of the frame to the outer side and press different surfaces of the frame, and at least one of the blades may have a recessed groove recessed inward on the blade surface and may separate a junction box attached to the outer surface of the stacked film simultaneously with the frame while keeping the junction box in the recessed groove.

The disassembling unit may include: a guide bar that is disposed in parallel with the glass plate and to which the scraper is movably coupled; and a moving heating plate that is movably coupled ahead of the scraper of the guide bar and separates at least a portion of the stacked film from the glass plate by heating the stacked film ahead of the scraper.

A movable solar module disassembling system according to the present disclosure includes: the movable solar module disassembling apparatus of the present disclosure; and an assistant movable disassembling apparatus that includes at least any one of a movable container unit that is hollow, can be moved by itself or external power, and has at least one door being able expose the inside by opening and closing, an assistant power unit that is disposed in the movable container unit, a crushing unit, and a separated-part loading unit.

BRIEF DESCRIPTION OF THE DRAWINGS

FIG. 5 is a conceptual diagram of a movable solar module disassembling system according to an embodiment of the present disclosure.

DETAILED DESCRIPTION

Figure 1:
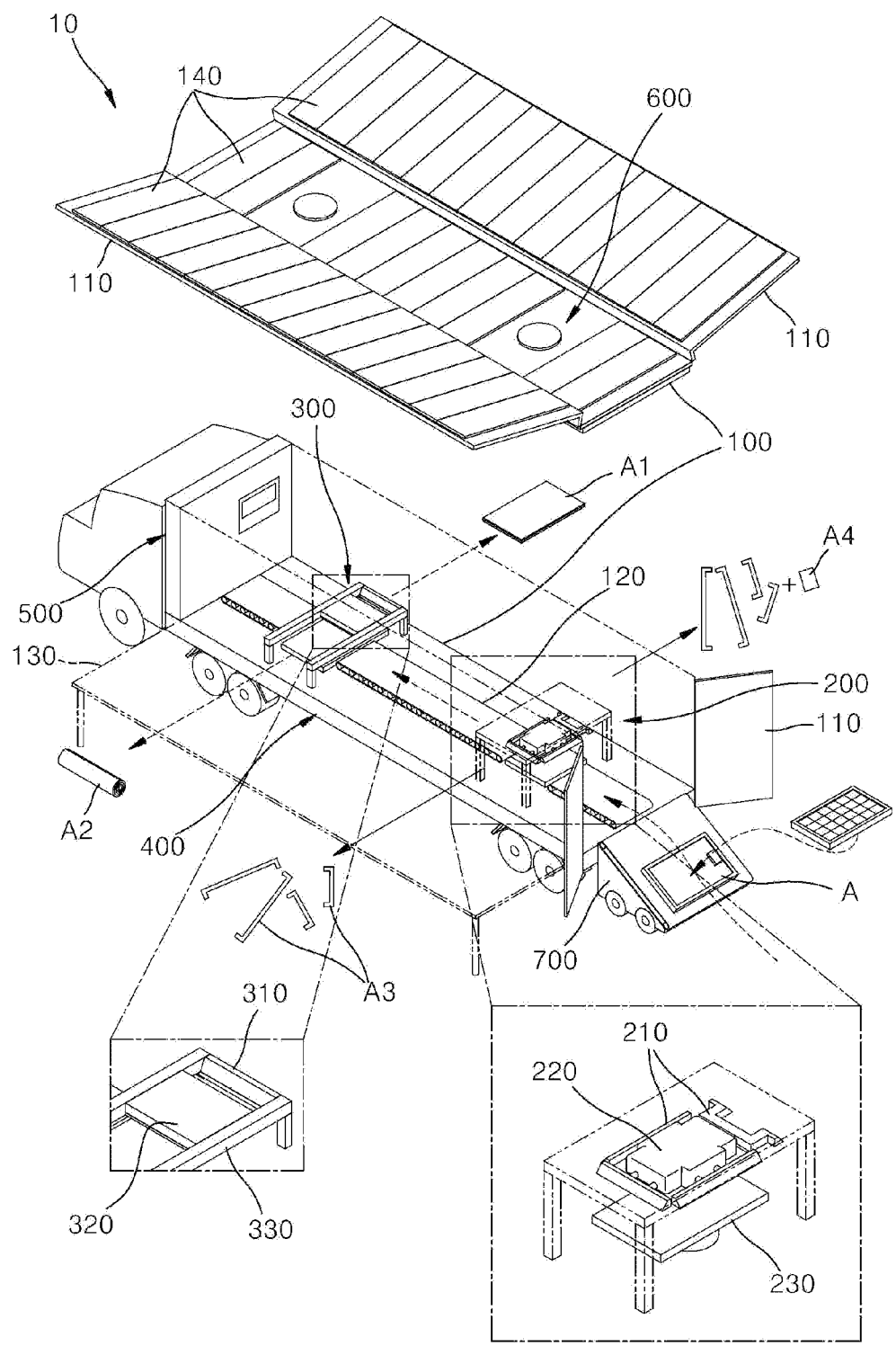
FIG. 1 is a conceptual diagram of a movable solar module disassembling apparatus according to an embodiment of the present disclosure.

The advantages and features of the present disclosure, and methods of achieving them will be clear by referring to the exemplary embodiments that will be described hereafter in detail with reference to the accompanying drawings. However, the present disclosure is not limited to the exemplary embodiments described hereafter and may be implemented in various ways, and the exemplary embodiments are provided to complete the description of the present disclosure and let those skilled in the art completely know the scope of the present disclosure and the present disclosure is defined by claims. Like reference numerals indicate the same components throughout the specification.

A movable solar module disassembling apparatus and a movable solar module disassembling system according to the present disclosure are described hereafter in detail with reference to FIGS. 1 to 5. The movable solar module disassembling apparatus is described in detail first with respect to FIGS. 1 to 4 and then the movable solar module disassembling system is described on the basis of the description of the movable solar module disassembling apparatus with reference to FIG. 5.

FIG. 1 is a conceptual diagram of a movable solar module disassembling apparatus according to an embodiment of the present disclosure.

Referring to FIG. 1, a movable solar module disassembling apparatus 10 according to the present disclosure has a structure in which a configuration (frame separation unit) for separating a frame A3 and a configuration (disassembling unit) for separating a glass plate A1 and a stacked film A2 including a solar cell are continuously disposed in a movable container unit 100. The movable solar module disassembling apparatus 10 has a characteristic that it can separate a junction box A4 too when separating the frame. The frame, glass plate, stacked film, and junction box are parts of a solar module A, and as shown in the figures, they are not completely crushed and are separately continuously separated in the movable container unit 100. Accordingly, the work related to replacement, discard, etc. of the entire solar module is conveniently performed at one place and the parts can be very easily recycled. The movable container unit 100, which is a structure that can accommodate and operate the configurations therein, for example, may be a trailer that is connected to a tractor (including a semi-trailer and a full-trailer) or the assembly of a tractor and a trailer. Accordingly, the present disclosure can disassemble a solar module while moving and changing places, and accordingly, can be very usefully used to integrally manage solar photovoltaic power generation facilities in wide range of areas at different places or manage large-scale solar photovoltaic power generation facilities applied in wide areas. Further, the present disclosure can be usefully used for removal.

The movable solar module disassembling apparatus 10 of the present disclosure is configured as follows. The movable solar module disassembling apparatus 10 for disassembling a solar module A including a glass plate A1, a stacked film A2 including a solar cell stacked on the glass plate A1, and a frame A3 surrounding a module body including the glass plate A1 and the stacked film A2, includes: a movable container unit 100 that is hollow, can be moved by itself or by external power, and has at least one door 110 being able to expose the inside by opening and closing; a frame separation unit 200 that is disposed in the movable container unit 100, includes a frame separation blade 210 pressing and separating the frame from the module body, is supplied with the solar module A from a side, and discharges the module body from another side after separating the frame A3; and a disassembling unit 300 that is disposed continuously with the frame separation unit 200 in the movable container unit 100, includes a scrapper 310 scraping and separating the stacked film A2 from the glass plate A1, is supplied with the module body from a side, and disassembles and discharges the module body into the stacked film A2 and the glass plate A1.

According to an embodiment of the present disclosure, the frame separation unit 200 may further include a position adjustment plate 230 that adjusts the vertical position of the solar module supplied from a side by supporting at the bottom and moving up and down the solar module such that the frame separation blade 210 and the frame at least partially cross each other. A plurality of frame separation blades 210 extends from the inner side of the frame to the outer side of the frame to press different surfaces of the frame. Here, at least one of the frame separation blades 210 has a recessed groove (see 210a in FIG. 2) recessed inward on the blade surface, so the junction box A4 attached to the outer surface of the stacked film can be kept in the recessed groove 210a and separated with the frame. The disassembling unit 300 may further include: a guide bar 330 that is disposed in parallel with the glass plate and to which the scraper 310 is movably coupled; and a moving heating plate 320 that is movably coupled ahead of the scraper 310 of the guide bar 330 and separates at least a portion of the stacked film from the glass plate by heating the stacked film ahead of the scraper 310. This configuration makes it possible to more precisely and effectively separate the parts of a frame module with minimum damage to the parts. The configuration, operation effect, etc. of the present disclosure are described hereafter in more detail on the basis of the embodiment of the present disclosure.

First, the structure of the solar module A that is the target to be disassembled by the present disclosure is briefly described. The solar module A may be formed by integrating a plurality of solar cells and may have integrated solar cells and a protector for protecting the solar cells. Referring to the box indicated by 'a' (showing a cross-section of the solar module A) at the lower portion in FIG. 2, the solar module A may include a glass plate A1, a stacked film A2 including a solar cell stacked on the glass plate A1, and a frame A3 surrounding a module body A' including the glass plate A1 and the stacked film A2. The frame A3 may be a metallic structure and may be an aluminum bar, etc. The frame A3 can serve to surround and protect the module body A'. The glass plate A1, which is disposed on the front surface (i.e., a light-incident surface) of the solar module A in actual use, can serve to prevent the stacked film A2 from being contaminated and maintain the shape of the stacked film A2. The solar cell may be included in the stacked film A2 and the stacked film A2 may include an encapsulation film, a back sheet, etc. that are disposed on both sides of the solar cell other than the solar cell. The junction box A4 may protrude from the outer surface (i.e., the rear surface opposite to the light-incident surface) of the stacked film A2 for cable connection, etc.

Referring to FIG. 1 again, the present disclosure can move to a solar photovoltaic power generation facility where the solar modules A are installed in a large scale, etc., and can immediately process wasted solar modules A. To this end, the present disclosure includes the movable container unit 100. As shown in FIG. 1, the movable container unit 100 is hollow, can be moved by itself or by external power, and has at least one door 110 being able to expose the inside by opening and closing. The movable container unit 100 may be a box-shaped structure mounted with a movable structure such as wheels, but is not limited thereto and may be formed in various movable structures. For example, the movable container unit 100 may be formed in a structure in which a movable frame with wheels and a box-shaped container are separably combined, or may include container of another shape rather than a simple box shape. The number of the container may be changed into one or more. The movable container unit 100, for example, may be a trailer that is connected to a tractor (including a semi-trailer and a full-trailer) or may be an assembly of a tractor and a trailer. The movable container unit 100 may be provided with power for moving from the outside or may have a driving unit and move by itself.

The inside of the movable container unit 100 may be changed in accordance with how the movable container unit 100 is implemented. The shape, structure, volume, height, width, etc. of the space can be changed if necessary. Accordingly, the shape and the inside arrangement of the movable container unit 100 shown in FIG. 1, etc. are only examples and are not necessarily understood as being limitative. The implementation type may be appropriately changed within the scope of the present disclosure. In an embodiment of the present disclosure, the movable container unit has a structure having a plurality of surfaces and maximizing the space utilization using the surfaces. The movable solar module disassembling apparatus 10 may further include a battery unit 400 disposed in parallel with and in contact with a first surface of the plurality of surfaces of the movable container unit 100, and a power conversion unit 500 disposed in parallel with and in close contact with a second surface different from the first surface. As in this embodiment, the first surface may be the floor of the movable container unit 100 and the second surface may be at least any one of sides of the movable container unit 100 which are perpendicular to the first surface.

That is, a battery insertion space, etc. is formed in the floor of the movable container unit 100 and a power supply battery is disposed on the floor of the movable container unit 100, thereby being able to form the battery unit 400 being in close contact with the floor. The power conversion unit 500 that converts and transmits the power from the battery unit 400 to the components and manages the power may be disposed in an erect state along a side of the movable container unit 100. Accordingly, it is possible to achieve the battery and power management structure that is very important in the movable apparatus without actual damage to the internal space using the outer surfaces of the movable container unit 100. The power conversion unit 500, for example, may include a PCS (Power Conversion/conditioning System) and may configure an ESS (Energy Storage System) in cooperation with the battery unit 400. The movable container unit 100, for example, may have a double-layered floor such that the inside can be at least partially filled with a battery, and the power conversion unit 500, for example, may be disposed in a compact type on a side, where the door 110 is not disposed, of sides.

The movable solar module disassembling apparatus 10 may further include a dust processing unit 600 that is disposed on a third surface of the plurality of surfaces of the movable container unit 100 and suctions and processes the dust inside the movable container unit 100. The dust processing unit 600 may be disposed on the top (i.e., ceiling) of the movable container unit 10, thereby being able to form an air purification structure without actual damage to the internal space. For example, the dust processing unit 600 may include a fan and a filter for suctioning and discharging air and may further include another contaminant processing structure other than the filter. As the dust processing unit 600 is disposed, it is possible to decrease the degree of contamination and perform work in a clean environment by purifying the internal air even though a solar module is processed inside.

A solar photovoltaic power generation unit 140 that generates power from the sunlight may be disposed outside the movable container unit 100. The solar photovoltaic power generation unit may include a plurality of solar cells and may be configured by integrating the solar cells at outer surface of the movable container unit 100. It is possible to generate power using the solar photovoltaic power generation unit 140 and store in the battery unit 400. Further, it is possible to smoothly supply power using the power stored in the battery unit 400, if necessary. According to the present disclosure, as described above, an ESS (Energy Storage System) can be configured using the power conversion unit 500 and the battery unit 400, so it is possible to efficiently manage the entire power including the power produced by the solar photovoltaic power generation unit 140, if necessary. In this manner, the movable solar module disassembling apparatus 10 produces power by itself and the produced power is efficiently used, whereby it is possible to smoothly operate other components including the frame separation unit 200 and the disassembling unit 300.

The door 110 of the movable container unit 100 may be formed at various positions. A plurality of doors 110 may be formed so that the internal space is appropriately exposed and disassembling is more smoothly performed. For example, as shown in FIG. 1, a door 110 that functions as an inlet for putting in the solar module A may be formed at the rear of the movable container unit 100 and another door 110 for widely opening the sides of the movable container unit 100 may be formed and used as an outlet for separated parts. If necessary, an expansion bed 130 that slides inward and outward may be disposed under the movable container unit 100 to expand the work space. However, as described above, the figure is only an example and is not necessarily limitative, and the door 110 may be installed at an appropriate position in consideration of various factors such as the progress direction of disassembling, the final discharge position of parts, etc. Accordingly, it is possible to appropriately change the positions of the frame separation unit 200, the disassembling unit 300, etc.

Though not shown, a conveying device such as a conveyer module may be disposed at the point where separated parts are discharged such as the sides of the movable container unit 100 so that the parts are automatically discharged. A movable supply unit 700 may be disposed at the inlet for the solar module A so that the solar module A is more smoothly supplied from the ground. That is, the movable solar module disassembling apparatus 10 may further include a movable supply unit 700 that moves up the solar module A from the ground outside the movable container unit 100, supplies the solar module A into the movable container unit 100, and can be moved by itself or by external power. That is, it is possible to more smoothly perform disassembling using a structure that automatically supplies a solar module in a movable type. The movable supply unit 700, for example, may include an inclined conveyer, etc., but is not limited thereto and may be freely changed into other structures that can move up a solar module from the ground. This structure, for example, may include a hydraulic lifter. The movable supply unit 700 may also include a moving unit such as wheels, and if necessary, may be coupled to a vehicle, etc. to be able to independently driven. The movable supply unit 700 can be changed in various forms.

An internal rail 120 connecting a disassembling process may be formed in the movable container unit 100, and the frame separation unit 200 and the disassembling unit 300 may be continuously disposed along the internal rail 120. A wasted solar module A is supplied into the movable container unit 100 through the inlet and then disassembled sequentially through the frame separation unit 200 and the disassembling unit 300. Hereafter, the structure and disassembling of the frame separation unit 200 and the disassembling unit 300 are described in more detail with reference to FIGS. 2 and 3.

Figure 2:
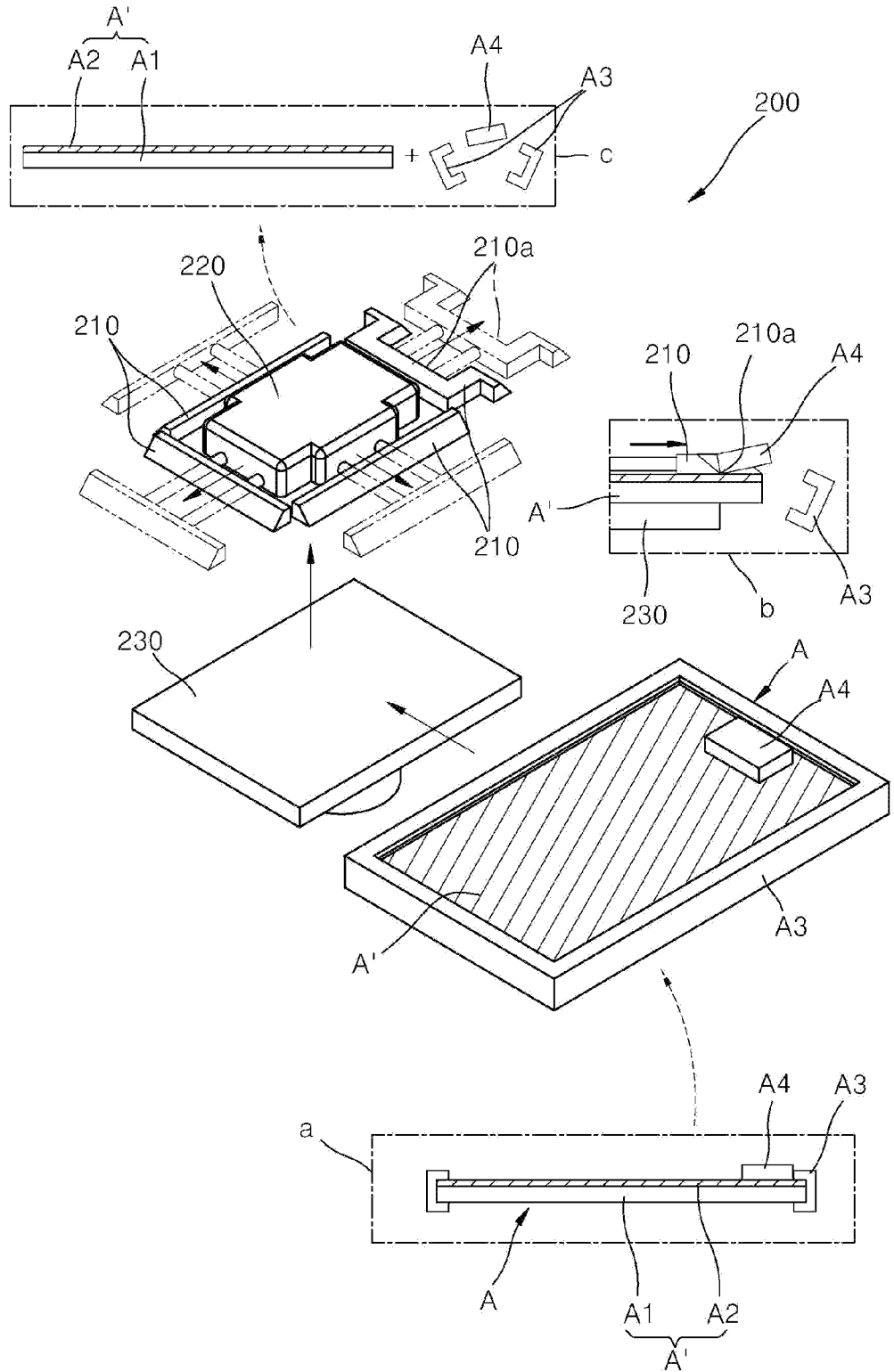
FIG. 2 is a diagram showing in detail the structure and operation of a frame separation unit of the movable solar module disassembling apparatus shown in FIG. 1.
Figure 3:
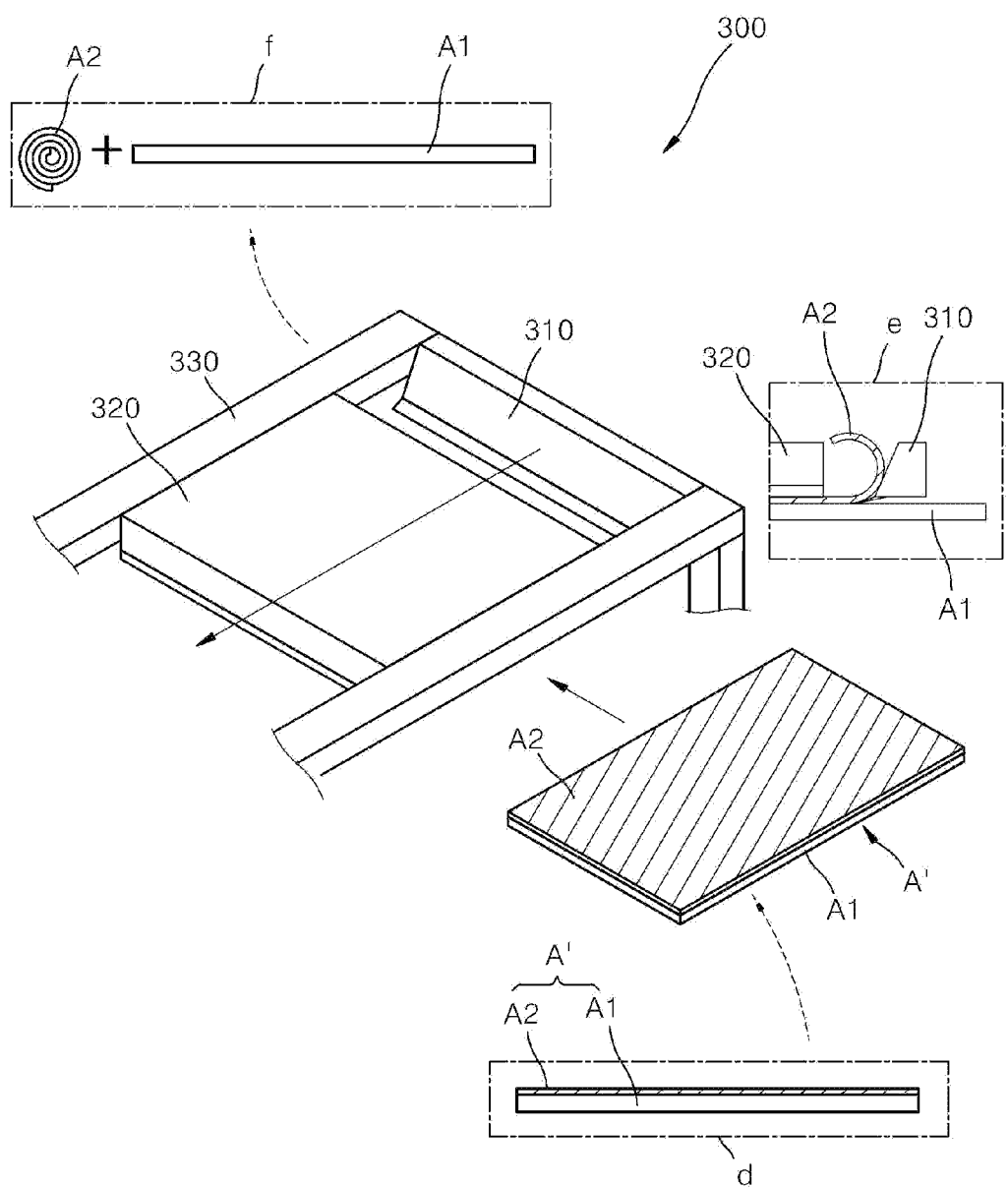
FIG. 3 is a diagram showing in more detail the structure and operation of a disassembling unit of the movable solar module disassembling apparatus shown in FIG. 1.

FIG. 2 is a diagram showing in detail the structure and operation of a frame separation unit of the movable solar module disassembling apparatus shown in FIG. 1, and FIG. 3 is a diagram showing in more detail the structure and operation of a disassembling unit of the movable solar module disassembling apparatus shown in FIG. 1. The parts indicated by boxes in FIGS. 2 and 3 are cross-sections showing the operation of disassembling a solar module in accordance with the order (a-b-c-d-e-f).

Referring to FIG. 2, a solar module A put in the movable container unit is processed first by the frame separation unit 200. The frame separation unit 200, as described above, is disposed in the movable container unit 100, includes a frame separation blade 210 pressing and separating the frame A3 from the module body A', is supplied with the solar module A from a side, and discharges the module body A' from another side after separating the frame A3. The frame separation unit 200 may include a position adjustment plate 230 that adjusts the vertical position of the solar module A supplied from a side by supporting at the bottom and moving up and down the solar module A such that the frame separation blade 210 and the frame A3 at least partially cross each other. Accordingly, the solar module A is supplied first to the position adjustment plate 230 and then the position adjustment plate 230 is moved up, thereby bringing the solar module A in contact with the frame separation blade 210. The frame separation blade 210 can press and separate the frame A3 and may be changed in various shapes within the purpose. Accordingly, the blade is not limited to the shape shown in the figures. The frame separation blade 210 may be formed to be acute at the end, and if necessary, it may be changed in various shapes.

Preferably, a plurality of frame blades 210 may be provided to correspond to the frame A3 disposed in a rectangular shape around the solar module A. For example, at least four frame separation blades 210 may be provided, as shown in the figure, to correspond to the sides of a rectangle, respectively. Each of the frame separation blades 210 may be coupled to a cylinder, which is operated by hydraulic pressure, to be operated, and an actuator 220 may include the cylinders. The actuator 220 shown in the figures is conceptual, so it is not limited thereto. Though not shown in the figures, a support frame supporting the actuator 220 may be disposed outside. The position adjustment plate 230 may also be coupled to a cylinder, which is operated by hydraulic pressure, to be vertically operated, and a fluid controller that supplies and controls hydraulic pressure to the cylinder may be disposed at an appropriate position around the frame separation unit 200. However, various structures that can apply pressure in the motion direction through a straight motion other than the cylinder structure may be applied as the actuating structure. It is possible to operate the frame separation blade 210 and the position adjustment plate 230 using various actuating structures.

In particular, a plurality of frame separation blades 210 may extend from the inner side of the frame A3 to the outer side of the frame A3 and may press different surfaces of the frame A3, and at least one of the blades may have a recessed groove 210a recessed inward on the blade surface. The frame separation blades 210 can keep the junction box A4 attached to the outer surface of the stacked film A2 in the recessed groove 210a and separate the junction box A4 together with the frame A3. For example, four frame separation blades 210 can contract as close to the actuator 220 as possible by moving toward the actuator 220 (in this state, the four frame separation blades all may be positioned inside the frame), can extend outward as shown in the figures after the position adjustment plate 230 loads and moves up the solar module A (accordingly, after the frame surrounds the outer sides of the four frame separation blades), and can separate the frame A3 by pressing different surfaces of the frame A3. The recessed groove 210a may be formed at at least any one of the frame separation blades 210 and may be formed by bending or cutting a portion the frame separation blade 210. It is also possible to form a blade at an end in the recessed groove by acutely machining the end.

According to this structure, a wasted solar cell A can be disassembled first as follows. The solar module A may have the cross-section indicated by the box 'a' at the lower portion in FIG. 2. The solar module A may be supplied with the front surface having the glass plate A1 thereon turned upside down, and accordingly, the glass plate A1 can be positioned at the lowermost bottom, the stacked film A1 can be positioned thereon, and the stacked film A2 can be surrounded by the frame A3. The junction box A4 protrudes from the top in the figure which is the rear surface of the solar module A. The solar module A is put on the position adjustment plate 230 and moved up, whereby the vertical position thereof is adjusted. Since the frame A3 protrudes wider up and down than the module body A' to surround the module body A', as shown in the box 'b' at the center in FIG. 2, when the frame separation blades 210 come in contact with the module body A', the frame can at least partially cross the frame separation blades 210. Accordingly, when the frame separation blades 210 expand outward, the frame A3 is disassembled by pressure. The frame A3 may be formed by bonding four bars, and the joints of the bars are separated, whereby the frame A3 can be disassembled.

The frame separation blade 210 having the recessed groove 210a simultaneously presses the junction box A4 and the frame A3 while keeping the junction box A4 in the recessed groove 210a, as shown in the box 'b'. Accordingly, the junction box A4 and the frame A3 can be simultaneously disassembled. The frame separation blade 210 having the recessed groove 210a may have a structure that can come in contact with the frame A3 at another portion rather than the recessed groove 210a while keeping the junction box A4. This structure, for example, may be a structure in which a portion of a blade symmetrically extends to both sides from the end of the recessed groove 210a. According to this structure, it is possible to remarkably reduce the disassembling time and simplify the process by disassembling the junction box A4 and the frame A3 at once.

When the junction box A4 and the frame A3 are disassembled, as shown in the box 'c' at the upper portion in FIG. 2, the module body A' including the glass plate A1 and the stacked film A2 is separated from other parts and then discharged. The module body A' is supplied to the disassembling unit along the internal rail (see 120 in FIG. 1) of the movable container unit, and the remaining frame A3 and junction box A4 can be discharged outside. An appropriately arranged conveyer structure, etc. may be used for discharging. As described above, it is possible to disassemble the frame A3 and the junction box A4 first.

Next, referring to FIG. 3, the module body A' with the frame removed is put into the disassembling unit 300 and disassembled into the stacked film A2 and the glass plate A1. The disassembling unit 300 is disposed continuously with the frame separation unit in the movable container unit, includes the scraper 310 that scrapes and separates the stacked film A2 from the glass plate A1, is supplied with the module body A' from a side, and disassembles and discharge the module body A' into the stacked film A2 and the glass plate A1. The disassembling unit 300 may include: a guide bar 330 that is disposed in parallel with the glass plate A1 and to which the scraper 310 is movably coupled; and a moving heating plate 320 that is movably coupled to the front of the scraper 310 of the guide bar 330 and separates at least a portion of the stacked film A2 from the glass plate A1 by heating the stacked film A2 ahead of the scraper 310. The guide bar 330 determines the movement direction of the scraper 310 and the moving heating plate 320 and is briefly shown in the figures. A driving unit that straightly actuates the scraper 310 and the moving heating plate 320 may be disposed on or in parallel with the guide bar 330, and the driving unit may include a cylinder that is operated by hydraulic pressure, etc. However, the present disclosure is not limited thereto, and it is possible to move them using various driving units that can apply pressure in the motion direction by straightly moving.

The scraper 310 has an acute blade on the bottom to be able to easily enter between the glass plate A1 and the stacked film A2. Though not shown, the scraper 310 itself may have a heater that applies heat to scrape the stacked film A2 in a heated state. The lower end of the moving heating plate 320 may be slightly spaced not to completely come in contact with the module body A', and a heating structure that applies heat to the module body A' may be formed at the lower end. The heating structure is not necessarily limited thereto, but for example, may be formed to heat the top (i.e., the stacked film) of the module body A' using hot wind and/or radiation heat. Accordingly, it is possible to more easily scrape and separate the stacked film A2 from the glass plate A1 at the rear portion using the scraper 310 while bending the stacked film A2 ahead of the scraper 310 using heat.

Accordingly, the module body A' can be disassembled as follows. The module body A' that is put into the disassembling unit 300 may have the cross-section shown in the box 'd' at the lower portion in FIG. 3. That is, as the frame and the junction box are disassembled as described above, only the glass plate A1 and the stacked film A2 are left and can be supplied to the disassembling unit 300. The disassembling unit 300 can scrape the stacked film A2, as shown in the box 'e' at the center in FIG. 3, while moving the moving heating plate 320 and the scraper 310 in the longitudinal direction of the module body A' supplied therein. The moving heating plate 320 that moves ahead can heat the stacked film A2 first and separate a portion of the stacked film A2 from the glass plate A1 (by bending using heat) and the scraper 310 can move behind the moving heating plate can completely remove the stacked film A2. The moving heating plate 320 can also prevent excessive deformation by partially coming in contact with the stacked film A2 bent by heat, and the gap between the moving heating plate 320 and the scraper 310 may be adjusted such that the shape can be maintained by elasticity of the stacked film A2. Accordingly, the moving heating plate 320 ahead appropriately flattens the stacked film A2 and the scraper 310 can more easily separate the stacked film A2 while following the moving heating plate. As described above, when the stacked film A2 is scraped and separated from the glass plate A1, the glass plate A1 and the stacked film A2 are disassembled, as show in the box 'f' at the upper end in FIG. 3.

Accordingly, the solar module can be completely disassembled into the parts of the frame, junction box, glass plate, and stacked film described above. As the frame is discharged separately from the module body, the glass plate and the stacked film are also discharged through different paths. As described above, the discharge process can be automatically performed using an appropriate conveyer structure of discharge. The stacked film A2 may be discharged, for example, while being rolled during scraping. This disassembling process is continuously performed in the movable container unit, whereby many solar modules can be processed without a problem.

Figure 4:
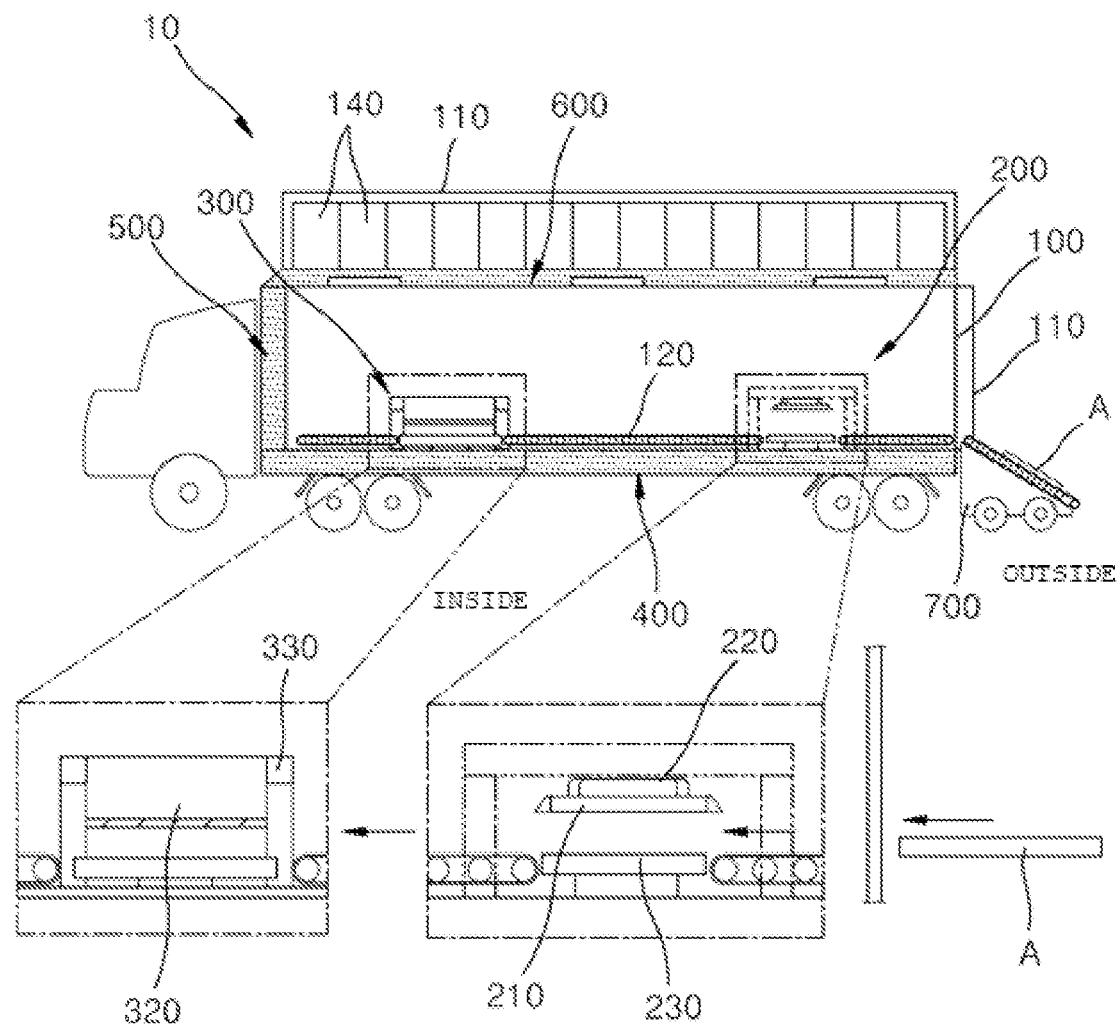
FIG. 4 is a diagram showing the internal structure of the movable solar module disassembling apparatus shown in FIG. 1.

FIG. 4 is a diagram showing the internal structure of the movable solar module disassembling apparatus shown in FIG. 1.

The above description is generally integrated as follow with reference to FIG. 4. The movable solar module disassembling apparatus 10 of the present disclosure can move to the place where a wasted solar module is required to be disassembled, and then disassembles a solar module A at the place, as shown in the figures. Even if the load of the wasted solar module A is large, the wasted solar module A can be easily supplied into the movable container unit 100 at a different height from the ground using the movable supply unit 700. Further, it is possible to perform disassembling while repeatedly supplying solar modules A into the movable container unit 100 through the supply process. As described above, the solar module A can be disassembled minutely into the frame, junction box, stacked film, and the glass plate sequentially through the frame separation unit 200 and the disassembling unit 300 continuously disposed in the movable container unit 100. Accordingly, since the module body is disassembled such that the parts are returned into the original components, the components can be very easily recycled. The glass plate can be washed and used for various purposes, and the metallic frame and the junction box can also be separated and recycled. If necessary, it is also possible to crush parts that can be crushed using a crusher and to separate and recycle the crushed powder in accordance with the materials. Accordingly, it is possible to move to a place where solar modules are required to be processed and quickly discharge the solar modules.

Hereafter, the movable solar module disassembling system according to the present disclosure is described in detail with reference to FIG. 5. The movable solar module disassembling system includes the movable solar module disassembling apparatus described above, the above description is referred to for the details of the movable solar module disassembling apparatus, and differences are mainly described.

Referring to FIG. 5, a movable solar module disassembling system 1 according to the present disclosure may be comprised of the movable solar module disassembling system 10 and an assistant movable disassembling apparatus 21, 22, 23, 24. That is, the movable solar module disassembling system 1 includes: the movable solar module disassembling apparatus 10 described above; and an assistant movable disassembling apparatus 21, 22, 23, 24 that includes at least any one of a movable container unit 21a, 22a, 23a, 24a that is hollow, can be moved by itself or external power, and has at least one door being able expose the inside by opening and closing, an assistant power unit (which may include a battery unit 21b, etc.) that is disposed in the movable container unit 21a, 22a, 23a, 24a, a crushing unit 22b, and a separated-part loading unit (which may include a first separated-part loading unit 23b, a second separated-part loading unit 23c, a third separated-part loading unit 24b, etc.) According to an embodiment of the present disclosure, a plurality of assistant movable disassembling apparatuses 21, 22, 23, and 24 may be provided, and each of them may be configured to assist the movable solar module disassembling apparatus 10 in different ways. Accordingly, the assistant movable disassembling apparatuses 21, 22, 23, and 24 may be partially different in structure. The movable solar module disassembling apparatus 10 and the assistant movable disassembling apparatuses 21, 22, 23, and 24 can move together, and can move together and function as one disassembling system at a processing place. Hereafter, the configuration of the assistant movable disassembling apparatuses 21, 22, 23, and 24 are described in more detail.

The assistant movable disassembling apparatuses 21, 22, 23, and 24 includes movable container units 21a, 22a, 23a, and 24a, respectively. The movable container units 21a, 22a, 23a, and 24a included in the assistant movable disassembling apparatuses 21, 22, 23, and 24 are also substantially the same as the movable container unit (see 100 in FIG. 1) of the movable solar module disassembling apparatus 10 described above. Accordingly, the description of the movable solar module disassembling apparatus 10 is referred to for description of them. The movable container units 21a, 22a, 23a, and 24a of the assistant movable disassembling apparatuses 21, 22, 23, and 24 may be configured in the same way as the movable container unit 100 of the movable solar module disassembling apparatus 10, and accordingly, the assistant movable disassembling apparatuses 21, 22, 23, and 24 can also be configured to be movable.

The assistant movable disassembling apparatuses 21, 22, 23, and 24 may have different configuration therein, depending on the purposes. For example, at least any one assistant movable disassembling apparatus 21 may include an assistant power unit disposed in the movable container unit 21a. The assistant power unit may be the battery unit 21b, and the assistant movable disassembling apparatus 21 may be used to supply power to the system. The assistant power unit is not necessarily limited to the battery unit 21b, and power supply units 22e, 23e, and 24d of other assistant movable disassembling apparatuses 22, 23, and 24 may function as the assistant battery unit. That is, it is possible to supply necessary power to the movable solar module disassembling apparatus 10 using the power supply structure of the assistant movable disassembling apparatuses 21, 22, 23, and 24. The power supply units 22e, 23e, and 24d may be comprised of an assistant battery disposed using the floor of the movable container units 21a, 22a, 23a, and 24a and a power conversion unit disposed using sides of the movable container units 21a, 22a, 23a, and 24a. The battery unit 21b may be configured by filling the movable container unit 21a with batteries by connecting the batteries to specifically supply a large amount of power.

At least any one assistant movable disassembling apparatus 22 may include the crushing unit 22b therein. The crushing unit 22b, for example, may be a press and used to crush wasted parts. It may also be possible to selectively load crushed objects left after crushing depending on materials by disposing both of the crushing unit 22b and a selecting unit 22c. The crushing unit 22b may be achieved in various types that can press and crush parts, and is not necessarily limited to that shown in the figures. The selecting unit 22c is also not necessarily limited to a specific structure and may be achieved in various structures that can sort parts in accordance with materials.

At least any one assistant movable disassembling apparatus 23, 24 may include a separated-part loading unit therein. The separated-part loading unit, for example, may be divided into a first separated-part loading unit 23b, a second separated-part loading unit 23c, and a third separated-part loading unit 24b. For example, the junction box and the frame are separately loaded in the first separated-part loading unit 23b and the second separated-part loading unit 23c, respectively, and they may be separately stored in one assistant movable disassembling apparatus 23. The glass plate A1 can be separately loaded in the third separated-part loading unit 24b. The glass plate A1 may be loaded in an erect state in a separated-part loading unit including a rack device. Accordingly, when a large space is required, the third separated-part loading unit 24b may be independently formed in another one assistant movable disassembling apparatus 24.

The movable solar module disassembling system 1 can be configured by combining the movable solar module disassembling apparatus 10 and a plurality of assistant movable disassembling apparatuses 21, 22, 23, and 24. The disassembling apparatus and the assistant disassembling apparatuses, for example, each may be an independent trailer, whereby the entire system can be moved by driving them along the road. Accordingly, post-work such as loading and crushing the separated part in addition to disassembling a solar module all can be performed in the movable system, and power can also be smoothly supplied. When performing work that generates a lot of dust, etc., the assistant movable disassembling apparatuses 21, 22, 23, and 24 include dust processing units 22d, 23d, and 24c and can perform the work while purifying the air, similar to the movable solar module disassembling apparatus 10. By disposing an appropriate configuration also in each of the assistant movable disassembling apparatus as described above, it is possible to provide a movable solar module disassembling system 1 that can very effectively process solar module while moving with the movable solar module disassembling apparatus 10.

According to the present disclosure, it is possible to immediately minutely disassemble a solar module including a solar cell at the site such that parts can be easily recycled. It is also possible to individually load and store the separated parts at the site and can transport the separated part to a place for recycling. The present disclosure can move to a desired place and process solar modules even if a solar photovoltaic power generation facility that requires the work is far, and accordingly, can greatly contribute to smoothly maintaining and managing a power generation facility not equipped with an appropriate processing facility. Further, the present disclosure is very useful for removal, etc.

Although exemplary embodiments of the present disclosure were described above with reference to the accompanying drawings, those skilled in the art would understand that the present disclosure may be implemented in various ways without changing the necessary features or the spirit of the prevent disclosure. Therefore, the embodiments described above are only examples and should not be construed as being limitative in all respects.

What is claimed is:

1. A movable solar module disassembling apparatus for disassembling a solar module including a glass plate, a stacked film including a solar cell stacked on the glass plate, and a frame surrounding a module body including the glass plate and the stacked film, the movable solar module disassembling apparatus comprising:

a movable container unit that is hollow, can be moved by itself or by external power, and has at least one door being able to expose an inside by opening and closing;
 a frame separation unit that is disposed in the movable container unit, includes a frame separation blade pressing and separating the frame from the module body, is supplied with the solar module from a side, and discharges the module body from another side after separating the frame; and
 a disassembling unit that is disposed continuously with the frame separation unit in the movable container unit, includes a scrapper scraping and separating the stacked film from the glass plate, is supplied with the module body from a side, and disassembles and discharges the module body into the stacked film and the glass plate.

2. The movable solar module disassembling apparatus of claim 1, wherein the movable container unit has a plurality of surface; and
 the movable solar module disassembling apparatus further comprises:
 a battery unit disposed in parallel with and in contact with a first surface of the plurality of surfaces of the movable container unit; and
 a power conversion unit disposed in parallel with and in close contact with a second surface different from the first surface.

3. The movable solar module disassembling apparatus of claim 2, wherein the first surface is a floor of the movable container unit and the second surface is at least any one of sides of the movable container unit which are perpendicular to the first surface.

4. The movable solar module disassembling apparatus of claim 2, further comprising a dust processing unit that is disposed on a third surface of the plurality of surfaces and suctions and processes dust in the movable container unit.

5. The movable solar module disassembling apparatus of claim 1, further comprising a solar photovoltaic power generation unit that is installed outside the movable container unit and produces power with sunlight.

6. The movable solar module disassembling apparatus of claim 1, further comprising a movable supply unit that moves up the solar module from a ground outside the movable container unit, supplies the solar module into the movable container unit, and can be moved by itself or by external power.

7. The movable solar module disassembling apparatus of claim 1, wherein the frame separation unit further includes a position adjustment plate that adjusts a vertical position of the solar module supplied from the side by supporting at a bottom and moving up and down the solar module such that the frame separation blade and the frame is at least partially cross each other.

8. The movable solar module disassembling apparatus of claim 7, wherein a plurality of frame separation blades extend from an inner side of the frame to an outer side of the frame and press different surfaces of the frame, and at least one of the blades has a recessed groove recessed inward on a blade surface and separates a junction box attached to an outer surface of the stacked film simultaneously with the frame while keeping the junction box in the recessed groove.

9. The movable solar module disassembling apparatus of claim 1, wherein the disassembling unit includes: a guide bar that is disposed in parallel with the glass plate and to which the scraper is movably coupled; and a moving heating plate that is movably coupled ahead of the scraper of the guide bar and separates at least a portion of the stacked film from the glass plate by heating the stacked film ahead of the scraper.

10. A movable solar module disassembling system comprising:
- the movable solar module disassembling apparatus of claim 1; and
- an assistant movable disassembling apparatus comprising at least one of an assistant power unit, a crushing unit, and a separated-part loading unit which are disposed in the movable container unit.

* * * * *